United States Patent [19]

Kuo et al.

[11] Patent Number: 5,497,076

[45] Date of Patent: Mar. 5, 1996

[54] DETERMINATION OF FAILURE CRITERIA BASED UPON GRAIN BOUNDARY ELECTROMIGRATION IN METAL ALLOY FILMS

[75] Inventors: Arthur T. C. Kuo; Ratan Choudhury, both of Milpitas, Calif.

[73] Assignee: LSI Logic Corporation, Milpitas, Calif.

[21] Appl. No.: 143,271

[22] Filed: Oct. 25, 1993

[51] Int. Cl.$^6$ .......................... G01R 31/28; G01R 27/14
[52] U.S. Cl. .................... 324/158.1; 324/719; 324/765
[58] Field of Search .......................... 324/158.1, 765, 324/766, 719, 703, 715

[56] References Cited

U.S. PATENT DOCUMENTS

| | | | |
|---|---|---|---|
| 3,474,530 | 10/1969 | Ainslie et al. | 29/825 |
| 4,213,087 | 7/1980 | English et al. | 324/719 |
| 4,483,629 | 11/1984 | Schwarz et al. | 324/703 |
| 4,652,812 | 3/1987 | Gimpelson et al. | 324/765 |
| 4,739,258 | 4/1988 | Schwarz | 324/703 |
| 4,816,895 | 3/1989 | Kikkawa | 257/757 |
| 4,897,709 | 1/1990 | Yokoyama et al. | 257/757 |
| 5,148,259 | 9/1992 | Kato et al. | 257/771 |
| 5,264,377 | 11/1993 | Chesire et al. | 437/8 |
| 5,291,142 | 3/1994 | Ohmi | 324/719 |

OTHER PUBLICATIONS

Dreyer et al; "An Electromigration Model That Includes The Effects of Microstructure and Temperature on Mass Transport"; Journal of Applied Physics; vol. 73 No. 10; pt. 1; pp. 4894–4902; 15 May 1993.

Nitta et al; "Evaluating The Large Electromigration Resistance of Copper Interconnects Employing a Newly Developed Accelerated Life–Test Method"; Journal of the Electrochemical Society; vol. 140; No. 4; pp. 1131–1137; Apr. 1993.

M. J. Attardo, R. Rutledge, and R. C. Jack, *Statistical Metallurgical Model for Electromigration Failure in Aluminum Thin–Film Conductors,* Journal of Applied Physics, vol. 42, No. 11 (Oct. 1971) pp. 4343–4349.

C. L. Bauer and P. F. Tang, *Electromigration in Thin Films,* Defect and Diffusion Forum, vols. 66–69 (1989) pp. 1143–1152.

James R. Black, *Mass Transport of Aluminum by Momentum Exchange with Conducting Electrons,* Proceedings of the Third International Congress on Microelectronics (1968) pp. 148–159.

(List continued on next page.)

*Primary Examiner*—Ernest F. Karlsen
*Attorney, Agent, or Firm*—Poms, Smith, Lande & Rose

[57] ABSTRACT

A critical temperature rise $\Delta R$ is selected at a value for which electromigration of atoms in the metal conductive line deposited on a semiconductive substrate is predominantly a grain boundary electromigration. Selection of the critical resistance rise is made by performing a number of tests on different ones of a plurality of substantially identical bow tie conductive lines formed of alternating narrow and wide sections interconnected by tapering line sections. Temperatures for the selection of the critical resistance rise are calculated rather than measured so as to more accurately reflect the relatively high local temperature at the site of a void in the metallic conductive line. Plot of a plurality of line widths against temperature for a given current density enables selection of a minimum line width or maximum void depth that will occur in a condition of predominantly grain boundary electromigration and before a large amount of bulk electromigration occurs. Utilizing empirically selected line widths (or void depth) and calculated temperatures, a critical value of $\Delta R$ resistance rise is calculated and structure of lines stressed to critical values of $\Delta R$ is visually observed by a scanning electron microscope. The lines are electrically stressed at different values of current density until the selected critical value of resistance rise occurs and elapsed time for such occurrence recorded. The results are used to solve for Ea, A and N in Black's equation, MTTF=A(J)$^{-N}$ exp (Ea/KT), also utilizing calculated temperature. Using a highest expected electrical current density and highest expected temperature with the calculated values of Ea, A and N, Black's equation is then solved for an expected mean time to failure (MTTF).

10 Claims, 3 Drawing Sheets

OTHER PUBLICATIONS

Robert E. Jones, Jr. and Larry D. Smith, *A New Wafer–Level Isothermal Joule–Heated Electromigration Test for Rapid Testing of Integrated–Circuit Interconnect*, Journal of Applied Physics, 61 (9) (May 1, 1987) pp. 4670–4678.

A. G. Milnes and C. L. Bauer, *Voids Associated with Electromigration in Metal Lines*, Solid–State Electronics, vol. 34, No. 7 (1991) pp. 741–746.

R. W. Pasco and J. A. Schwarz, *Temperature–Ramp Resistance Analysis to Characterize Electromigration*, Solid–State Electronics, vol. 26, No. 5 (1983) pp. 445–452.

K. Sato, A. J. Patrinos, C. Y. Chang, R. W. Vook, and J. A. Schwarz, *Kinetic Study of Electromigration in Al and Al Alloy Thin Films by Combined Resistance and Temperature Change Measurements*, Journal of the Electrochemical Society, vol. 138, No. 9 (Sep. 1991) pp. 2274–2778.

Harry A. Schafft, *Thermal Analysis of Electromigration Test Structures*, IEEE Transactions on Electron Devices, vol. ED–34, No. 3, (Mar. 1987) pp. 664–672.

H. U. Schreiber, *Activation Energies for the Different Electromigration Mechanisms in Aluminum*, Solid–State Electronics, vol. 24 (1983) pp. 583–589.

H. U. Schreiber and B. Grabe, *Electromigration Measuring Techniques for Grain Boundary Diffusion Activation Energy in Aluminum*, Solid–State Electronics, vol. 24, No. 12 (1981) pp. 1135–1146.

R. A. Sigsbee, *Electromigration and Metalization Lifetimes*, Journal of Applied Physics, vol. 44, No. 6 (Jun. 1973) pp. 2533–2540.

T. E. Volin, K. H. Lie and R. W. Balluffi, *Measurement of Rapid Mass Transport Along Individual Dislocations in Aluminum*, Acta Metallurgia, vol. 19 (Apr. 1971) pp. 263–274.

Bryan J. Root and Tim Turner, *Wafer Level Electromigration Tests for Production Monitoring*, IEEE/IRPS (1985) pp. 100–107.

DETERMINATION OF FAILURE CRITERIA BASED UPON GRAIN BOUNDARY ELECTROMIGRATION IN METAL ALLOY FILMS

BACKGROUND OF THE INVENTION

1. Field of the Invention

The present invention relates to analysis of integrated circuits, and more particularly concerns determination of failure criteria for thin metallic film conductors.

2. Description of Related Art

Electromigration of atoms and ions is of major concern with respect to reliability and failure of integrated circuits. Under stress due to flow of electrical current and temperature, atoms and ions of metal, such as aluminum atoms or ions, of thin interconnect metallic conductors laid down on a semiconductor substrate actually move through the structure of the metal. This movement, or electromigration, from one point to another within the metal structure may cause either a void at the position originally occupied by the moving atom or a deposition or growth at one area of the metal. It has been determined that in many configurations of integrated circuits void formation is the defect most likely to decrease the life of the circuit or to result in failure. The metallic interconnect lines on the integrated circuit are very thin and very narrow, in the order of just a few micro meters for example, so that electromigration may induce a void that results in a significant narrowing of the electrically conductive material across the width or thickness of the conductive line. Decreased width of the line will tend to cause failure over a much shorter life or may in fact result in an open line. Therefore, it is highly desirable to be able to characterize electromigration properties of an interconnect metal line so as to determine a median life time to failure (MTTF), the activation energy (Ea) of grain boundary diffusion and the current density dependance or current density exponent (N).

In the past such electromigration criteria have been obtained through conventional DC electromigration tests performed on a completely packaged chip but with greatly enhanced or exaggerated current densities (in the order of about one million amps per square centimeter) and at elevated temperatures (in the order of about 150° C. to 250° C.). Such tests have been performed such that resistance of the line under test increases by about thirty percent, thus indicating a line of decreased width, because the resistance increases as the width decreases due to a void or similar defect. Elapsed time for this amount of resistance increase to occur was measured. Under this prior art test a number of measurements are made at various temperatures and at various current densities to obtain data sufficient to solve for unknown values of Ea (activation energy), N (current density exponent) and A (a proportionality constant) in Black's equation, which is as follows:

$$MTTF = A(J)^{-N} \exp(Ea/KT) \qquad \text{Equation (1)}$$

where K is the Boltzmann constant, T is temperature, J is current density, and MTTF is the mean time to failure in years. At each of the several different current densities resistance is measured and the value of MTTF at a point where the resistance increases by thirty percent is employed to solve for the quantities Ea, N and A. Then, utilizing the highest actual temperature and current density expected to be encountered during actual operation, the value of MTTF is calculated by Black's equation, Equation (1), to provide a measure of the life of the equipment or integrated circuit under observation. In these prior tests temperature is measured temperature of the integrated circuit.

A major problem associated with this prior art testing is that the test is conducted after the complete assembly of the chip. In the normal semiconductor chip manufacture, a large number of chips are formed on a single semiconductive wafer, and there are a sufficient number of steps taken subsequent to the formation of the chips on the wafer in the assembly of a final chip that a long time may elapse before the final structure is completed and ready for this testing. This means that all of the subsequent manufacturing steps and assembly must be completed and assembly must be at least partially complete before this type of lifetime testing can be made to determine whether or not the metal interconnect layers are or are not satisfactory.

Further, the prior DC current flow test employs externally generated temperature to heat the conductive material under test well above room temperature and utilizes a high resistance change, as much as thirty percent increase in resistance, as the estimated failure point. These conditions and features of the prior tests introduced errors in measurement, as will be discussed below.

Several wafer level electromigration test methods have been proposed utilizing the wafer prior to the full assembly of the packaged chip. Unlike the conventional test, these methods use considerably higher current density and higher temperature to actually attempt to accelerate the electromigration phenomenon in the thin metal films. The advantage of these methods is the greatly shortened testing period. These methods include those known as TRACE, SWEAT, Isothermal and BEM, as described in references 1 through 4 appended to the end of this written description. In the TRACE technique resistance change is monitored during a constant current ramped temperature test in which temperature is continuously increased. Resistance change in the metal line is attributed to the electromigration effect. The disadvantage of using this method is that the external temperature source, which supplies an increasing temperature, may affect the neighbor test structure on the same die or wafer. Further, this test is not applicable for use as an on-line process monitor.

BEM (breakdown energy of metal) utilizes a ramp or increasing current without external temperature source to monitor the quality of metalization. This test is limited by its requirement of a previous known activation energy of the metal for calculation. Therefore, this method does not allow derivation of the properties of electromigration such as Ea, A and N for an unknown material.

Isothermal test, as reported in Reference 3, involves a computer reading of multi meters and calculates sample resistance used in a feedback loop to control power supply voltage such that the temperature sample can be kept constant. The ability of this method to obtain accurate measurement is questionable.

SWEAT (standard wafer level electromigration accelerated test), as reported in Reference 2, attempts to achieve a constant acceleration factor using known Ea and N. This test has successfully demonstrated measurement of relative metal quality but fails to adequately explain failure mechanisms, and thus can only be employed with a catastrophic failure.

Patents related to the problem of electromigration and integrity of thin film interconnect lines of integrated circuits include the following: U.S. Pat. No. 4,483,629, 4,739,258, 4,213,087, 3,474,530, 4,816,895, 4,897,709 and 5,148,259. None of these patents, nor any of the methods, are capable of demonstrating an ability to identify failure mechanisms or to measure basic electromigration properties.

Accordingly, it is an object of the present invention to provide for determination of failure criteria in metal alloy films in a manner that avoids or eliminates above mentioned problems.

SUMMARY OF THE INVENTION

In carrying out principles of the present invention in accordance with a particularly disclosed embodiment thereof, electromigration induced failure of a thin film conductor that is typical of thin film conductors incorporated in integrated circuits is evaluated for conductors that are subject to failure due to grain boundary and bulk electromigration of atoms in the conductor when the conductor is stressed by electric current and temperature. The method comprises forming a plurality of conductive test patterns on a semiconductor substrate, which test patterns exhibit a resistance rise $\Delta R$ when an electric current flows therein. A critical value $\Delta R_c$ of resistance rise is selected for conditions resulting from electromigration that is predominantly grain boundary electromigration. The conductive test patterns are electrically stressed at a plurality of current densities by application of electric current, and resistance rise of the conductive test patterns is measured during this electrical stress. There is recorded the elapsed time until the measured resistance rise reaches the critical value of $\Delta R_c$, and this elapsed time is employed to determine values of activation energy Ea, a proportionality constant A and a current density exponent N by utilizing Black's equation, $MTTF=A(J)^{-N} \exp(Ea/KT)$. The calculated values of Ea, A and N, together with a calculated conductive test line temperature, are used in the Black's equation with a maximum expected current density and a maximum expected temperature to determine the mean time to failure (MTTF). This enables the determination of certain failure mechanism criteria, including Ea, A and N, and expected lifetime.

According to one feature of the invention, test criteria are selected and specifically critical resistance rise, $\Delta R_c$, is selected so as to ensure that the electromigration that occurs is predominantly grain boundary migration, and not predominantly bulk migration.

It has been determined that electromigration along grain boundaries has the greatest effect upon evaluation of failure criteria. Activation energy, Ea, of grain boundary electromigration in aluminum thin films, for example, is smaller than activation energy of bulk migration, and these grain boundary activation energies may occur under conditions where bulk electromigration becomes vanishingly small. It has been determined that grain boundary electromigration predominates below temperatures of about 460° C. for aluminum alloys and that critical resistance rises as small as 0.5% to about 2% will yield significantly useful information concerning grain boundary electromigration.

BRIEF DESCRIPTION OF THE DRAWINGS

In the accompanying drawings.

DETAILED DESCRIPTION OF THE PREFERRED EMBODIMENTS

GENERAL DISCUSSION

The methods described below are based upon several novel assumptions. It is believed that although electromigration may be due to various types of electromigration including grain boundary migration, bulk migration, grain/bulk electromigration, defect electromigration, and surface electromigration, the atom or ion movement caused by grain boundary motion under electrical current stress is the primary cause of electromigration effects that have been noted in thin film metallic interconnect lines. This belief is supported by the fact that grain boundary electromigration requires an activation energy of as little as 0.4 through 0.9 electron volts, whereas bulk migration requires an activation energy of about 1.4 electron volts. On this basis various tests are run under conditions where grain boundary electromigration predominates and where there is relatively little bulk electromigration. Therefore, there is selected for operating the tests a critical resistance rise that occurs under conditions of predominantly grain boundary electromigration.

It has been determined that bulk diffusion predominates at temperatures above about 460° C. and is relatively small at lower temperatures, whereas below 460° C. grain boundary electromigration predominates. Therefore, use of a critical resistance rise that is based primarily on grain boundary electromigration and that occurs in conditions below 460° C. may be utilized. Examination of local temperature, and therefore resistance rise adjacent a void is utilized in conjunction with graphic plots of variation of temperature with line width to determine resistance rise that is due to localized temperature adjacent the void. This enables determination of a critical resistance rise for use in test measurements. Calculated critical resistance rise may be checked by visual examination of conductive line structure under a scanning electron microscope. If the visual examination indicates that a significant amount of bulk diffusion takes place in addition to the grain boundary electromigration, the critical temperature or resistance rise value is lowered and the calculation of a critical resistance rise is revised until the scanning electron microscope observation indicates the electromigration phenomenon is primarily grain boundary electromigration.

It is assumed that the resistance rise is due to a local temperature rise at the point of void formation and therefore cannot be physically measured with any accuracy because the location of void formation cannot be determined. For this reason the method described herein employs a calculated temperature for determination of the critical resistance rise and for use as a temperature value in Black's equation.

If calculated temperature exceeds a maximum temperature of 460° C. (above which bulk electromigration predominates), electric current density of the test is decreased so as to obtain a measured resistance rise based upon a temperature below 460° C. In this manner the measurements are limited to conditions where grain boundary electromigration predominates.

In general, a method described herein determines quantities indicative of electromigration characteristics of a thin metallic interconnect line by use of Black's equation and a selected critical resistance rise under stress induced by high electrical current density. The critical resistance rise is determined for conditions in which grain boundary electromigration predominates. Results of tests run with the uniquely selected critical resistance rise are employed with a calculated local temperature at a void to compute electromigration characteristics Ea, A and N. The critical temperature rise is calculated on the basis of empirically determined size of voids caused by grain boundary electromigration and utilizing temperatures calculated on the basis of empirically determined insulator conductivities ($K_I$). A size of an electromigration induced void is empirically determined for a temperature below which grain boundary electromigration predominates and above which bulk electromigration predominates. Based upon such selected void size, the critical resistance rise is calculated.

Figure 1:
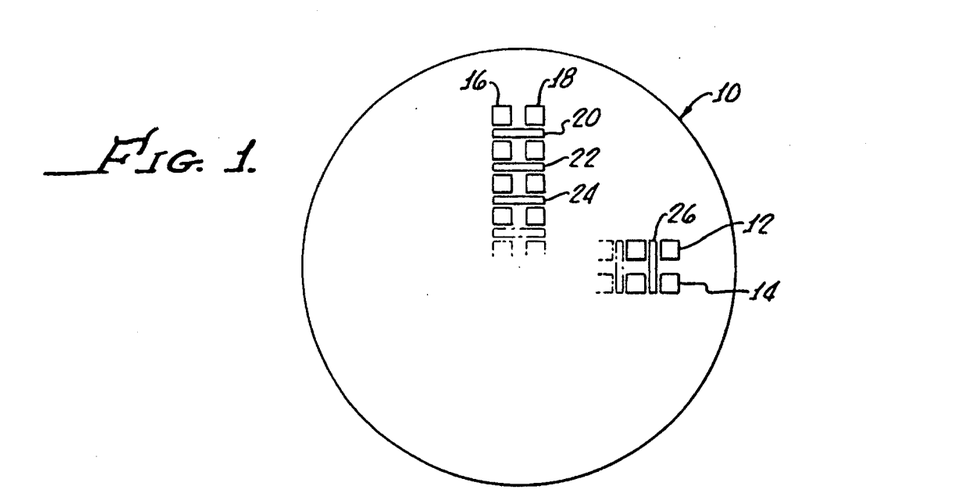
FIG. 1 illustrates a wafer having a number of integrated circuit chips formed thereon with a plurality of electrically conductive test patterns formed at scribe lines between the chips.

As illustrated in FIG. 1, typical semiconductive wafer 10, made of silicon dioxide or the like, has formed thereon a plurality of integrated circuit chips 12,14,16,18, etc., having spaces therebetween for scribe lines, along which scribe lines the wafer will be cut to separate the chips individually from each other. In this wasted area between the chips, before separation, a plurality of electrically conductive test patterns are formed, as generally indicated at 20,22,24,26 of FIG. 1.

Figure 2:
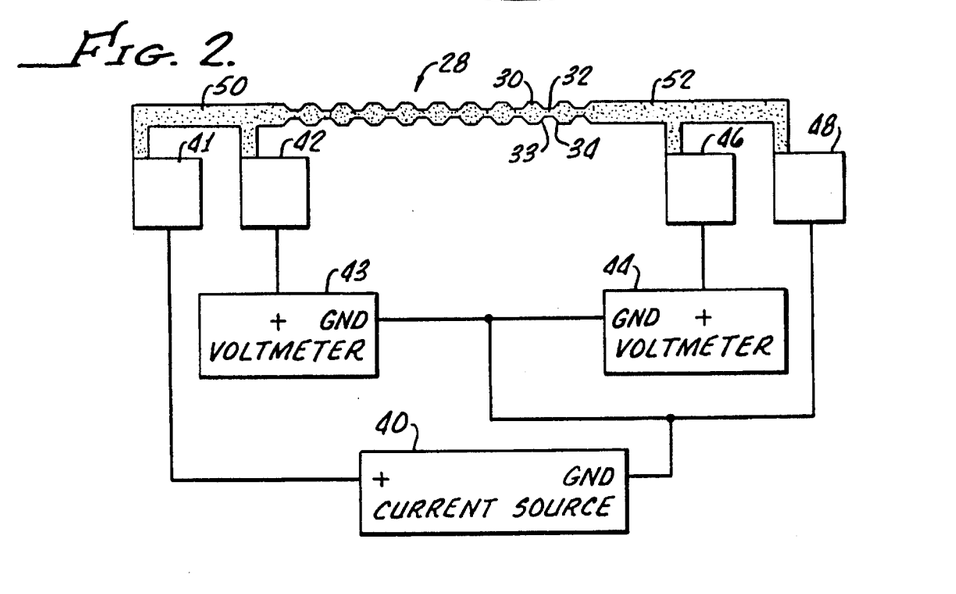
FIG. 2 illustrates a typical one of the test patterns and its connections to measuring equipment.

Illustrated in FIG. 2 is a single one of these electrically conductive test patterns shown as comprising a test line 28 formed of alternating wide sections 30 and narrow sections 32 interconnected to one another by tapered sections 33,34. The alternating wide/narrow conductive test line 28 is connected to a series of conductive test pads 41, 42, 46 and 47, with one end of the test line 28 being connected to pads 41 and 42 by a line extension 50, and the other end of the conductive line being connected to pads 46,48 by an extension 52 of the conductive test line 28. For the electromigration test pattern 28, pads 41 and 48 are connected to a current source 40 to provide the electrical stressing current, and pads 42 and 46 provide for a voltage measurement by connection to grounded voltmeter 43,44.

A conventional Kelvin structure (not shown) is provided for measurement Of resistivity and thermal coefficient of resistance. For electromigration test measurements an electrical stressing or forcing current is provided by current source circuit 40 connected to pads 41 and 48, and voltage across the stressed line 28 is measured by circuit 43,44 connected to pads 42 and 46.

An exemplary structure includes the described and illustrated alternately narrow and wide sections connected in series by means of tapered sections. This design creates a high current density gradient from wide to narrow sections and a high stress gradient with a larger thermal gradient, all of which tend to favor occurrence of electromigration phenomenon in the region of the narrow sections 32 of the test line.

In a particular example each narrow region has a width of about 2.4 µm and a length of 12 µm. Each wide region has a width of about 26.4 µm and a length of 12 µm, with each tapered region having a length of 12 µm. In a particular example, two different silicon dioxide wafers are employed and cleaned before deposition of metallic aluminum alloys. On a first wafer an aluminum with 1% silicon copper was employed, and on the other an aluminum with 0.75% silicon copper was employed, both deposited by sputtering with 7.8 kilowatts of power at a substrate temperature of 275° C. and a base pressure of $4 \times 10^{-7}$ torr. Thickness of the deposited metal films is about 0.84 µm in this example. Thereafter, utilizing standard photolithographic etching processes, the described electrically conductive "bow tie" test patterns, as illustrated in FIG. 2, are formed on the scribe lines between those sections on which the chips have been formed. Subsequent to the photolithographic forming of the bow tie test pattern of FIG. 2, two layers of silicon dioxide are deposited on the top of the metal films at 400° C. to provide an upper planarization layer of about 1.5 µm total on top of the metal line.

Figure 2A:
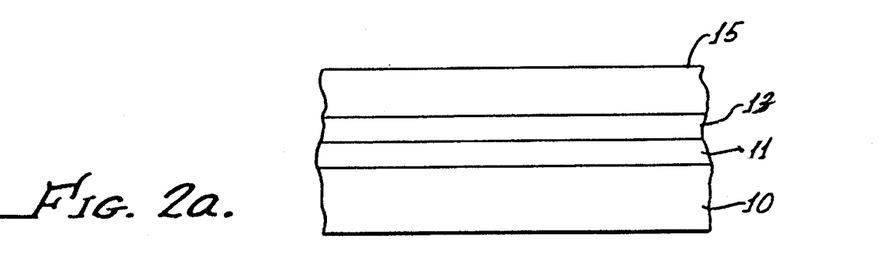
FIG. 2a is a cross section of the test pattern laid down on a wafer.

One of the lines (not shown) comprises a line of 1,000 µm in length forming part of a conventional Kelvin structure. Resistivity and thermal coefficient of resistance ($T_{CR}$) are measured on the Kelvin structure utilizing a Reedholm RI-20 parametric tester. A cross section of the test pattern laid down on the wafer is illustrated in FIG. 2a as typically including the wafer 10 and a dielectric layer 11 of about 0.75 µm thick. The aluminum metallic conductive layer 13 on top layer 11, has a thickness of about 0.84 µm and is formed in the bow tie pattern shown in FIG. 2. An insulating cover layer 15 of silicon dioxide has a thickness of about 1.25 µm. The purpose of the procedures described herein is to enable evaluation of electromigration characteristics of the test patterns formed in metallic conducive layer 13.

A significant aspect of this wafer level electromigration test is the use of very high stress current density, in the order of one hundred million or more amperes per square centimeter. This very high current density results in a dramatic increase in temperature of the thin film due to the joule-heating effect. No other heat source and no external heating is employed.

According to one aspect of the present invention, rather than attempt to directly measure temperature, temperature ($T_M$) of the metal conduction test pattern is calculated according to the following equation:

$$T_M = Ta + \frac{J^2 R_0}{\Sigma[K_I/tt_I (1 + 0.88\, t_I/W)] - J^2 T_{CR} R_0} \quad \text{Equation (2)}$$

and $$\Sigma [K_I/tt_I (1 + 0.88\, t_I/W)] = K_I/tt_t (1 + 0.88\, t_t/w) + \quad \text{Equation (3)}$$

$$K_I/tt_b (1 + 0.88\, t_b/w) + 2 \times 0.88\, K_I/tw)]$$

where Ta is room temperature, J is current density, $R_o$ is resistivity of the metal conductor at 0° C., $K_I$ is the thermal conductivity of the insulator (silicon dioxide layers 11 and 15 of the section of FIG. 2a), t is thickness of the metal conductor, $t_t$, $t_t$ and $t_b$ is the thickness of the insulating material, both top and bottom, respectively, and w is width of the conductive line at its narrow section.

Figure 3:
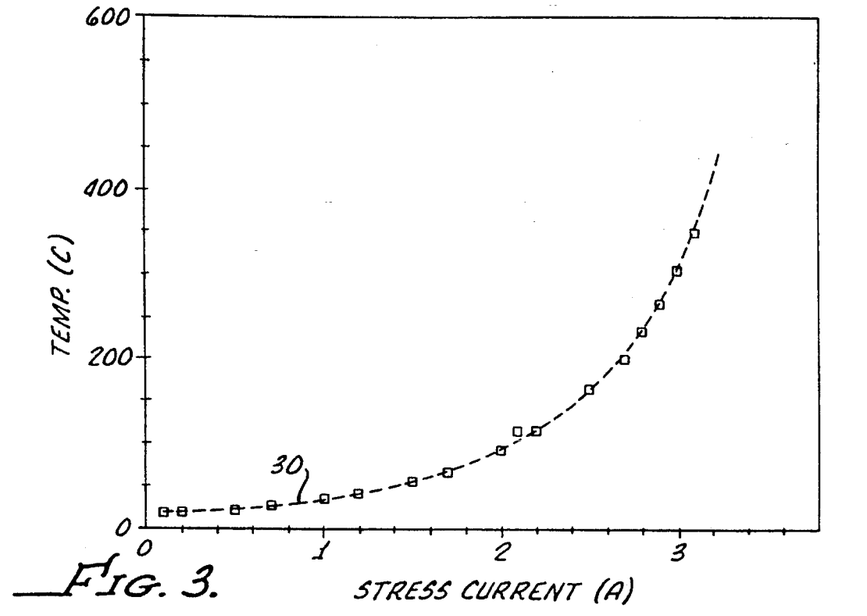
FIG. 3 illustrates a curve of current plotted against temperature variation showing an empirical curve fitting to determine insulator thermal conductivity $K_i$.

For solution of the temperature equations (2) and (3), insulator thermal conductivity $K_I$ is determined empirically by a trial and error curve fitting arrangement illustrated in connection with FIG. 3. The metal line is stressed at different electrical currents, and temperature at each current is plotted, as indicated in FIG. 3. Thus, the small squares indicate experimentally determined points of stress current in amperes versus temperature in degrees C. Then an arbitrary value of $K_I$ is selected, and Equations (2) and (3) solved for $T_M$ at a number of different values of stress current. The several computed values provide a curve of shape similar to the curve of the experimental data of FIG. 3. Additional values of $K_I$ are chosen and used in repetitive calculations to obtain a curve for one of the selected $K_I$ values, as indicated by curve 30 of FIG. 3, that corresponds to the experimentally obtained values. Thus this trial and error curve fitting technique involving repetitive calculations of $T_M$ using different values of $K_I$ result in an empirically determined value of $K_I$. In one specific example the insulator thermal conductivity has been determined to be 0.0099 Watts per degree centigrade.

Figure 4:
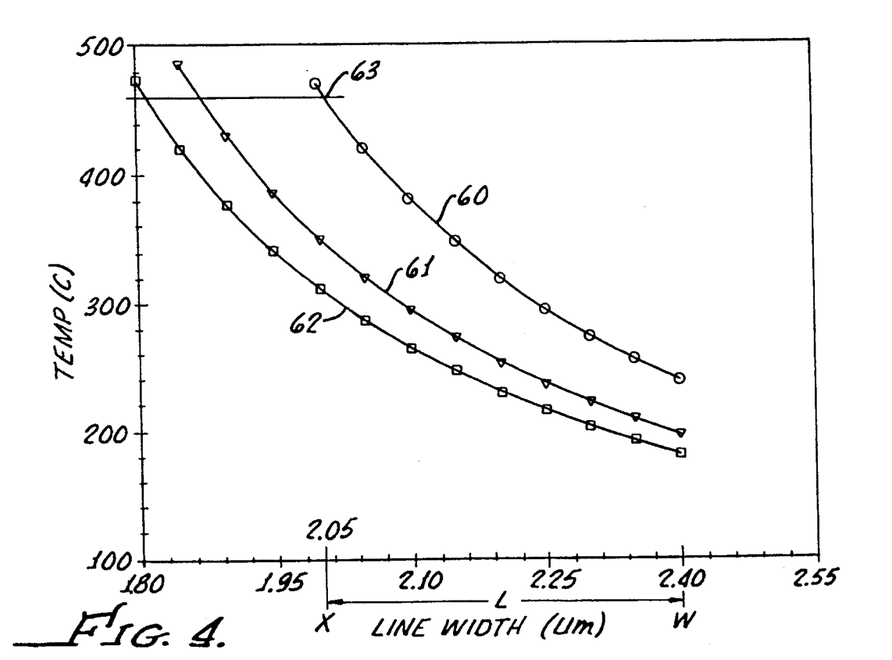
FIG. 4 illustrates a plurality of curves showing variation of temperature with line width.
Figure 4A:
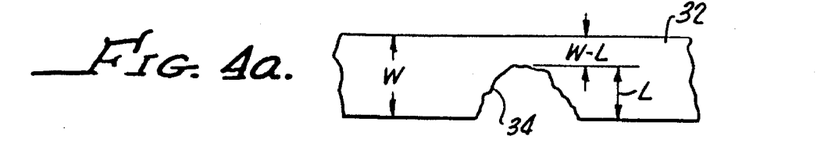
FIG. 4a illustrates a theoretical void that occurs in a conductive line of width W.

As mentioned above, grain boundary electromigration generates changes in the film structure by causing a void formation and also changes the film resistance. FIG. 4a (sheet 3) illustrates the concept of void formation in a metal conductive line 32, having a width W, and having a void 34 formed therein by grain boundary electromigration. In this illustration the depth of the void is indicated as L so that the remaining conductive width at the area of the void is W–L. Thus it is apparent that the void causes an increase in local current density because of the decrease in effective conducting width, and this results in increase of local temperature at areas adjacent the void.

The resistance change in the area of the void due to the narrowed conductive area is estimated roughly as follows:

$$R_v = -(2R_o(1+T_{CR}(T-T_o)/h) \ln (1-(L/W)) \quad \text{Equation (4)}$$

where $R_o$ is the resistivity of the conductive line at room temperature, h is its thickness, L is the depth of the void, W is nominal width of the line before stressing, T is temperature calculated according to Equations (2) and (3) for a line having an effective thickness of W–L, $T-T_o$ is temperature calculated according to Equations (2) and (3) for a line having a nominal width W. Depth of void is determined as set forth below in connection with FIG. 4.

For each of several selected current densities a number of lines, each of a different width, are stressed at such current densities and temperature measured. Results are shown in curves 60, 61 and 62 of FIG. 4, where curve 60 represents a curve obtained employing current density of 14.3 million amps per square centimeter, curve 61 represents data obtained with a current density of 13.5 million amps per square centimeter, and curve 62 represents data obtained with a current density of 13.19 million amps per square centimeter. Selecting one of these curves, such as, for example, curve 60, a point 63 is located thereon at which the curve attains the temperature of 460° C. As mentioned above, it is desired to maintain test conditions at temperatures below 460° C. so that grain boundary electromigration predominates and that little bulk electromigration occurs. A line width corresponding to point 63 (the 460° C. temperature point of curve 60) is then selected from the graph to yield a line width of for example 2.0 μm. Thus it is assumed that the maximum temperature established for these tests occurs when the remaining line width at the area of the void is 2.0 μm. Initial line width, prior to stressing and prior to any electromigration, is 2.4 μm, wherefore the crack depth for this particular example is determined to be 0.4 μm (e.g., 2.4–2.0), and the effective line width at the void is 2.0 μm. For solutions of Equation (4) resistance change of the line structure due to the formation of a void can be calculated as follows:

$$\Delta R = R_2 - R_1/R_1 \quad \text{Equation (5)}$$

where $R_2$ is resistance calculated according to Equation (4) for a line having a void depth equal to the value of L selected from curve 60 of FIG. 4, and $R_1$ is the value of R calculated from Equation (4) utilizing a void depth of 0, that is, for a line without a void.

It is found that for a local temperature at or above $0.7 T_M$, where $T_M$ is the melting point of the metal, bulk diffusion predominates. At such a local temperature the resistance rise calculated using Equations (4) and (5) is about 1.2%. Therefore, to maintain the test conditions such that grain boundary electromigration predominates, a total resistance change that is not significantly greater than 1.2% is employed. Based upon these criteria failure times are defined by selecting a critical total resistance rise from among values of 0.5%, 1% and 5%, which effectively span the 1.2% resistance rise but are still close.

Figure 5:
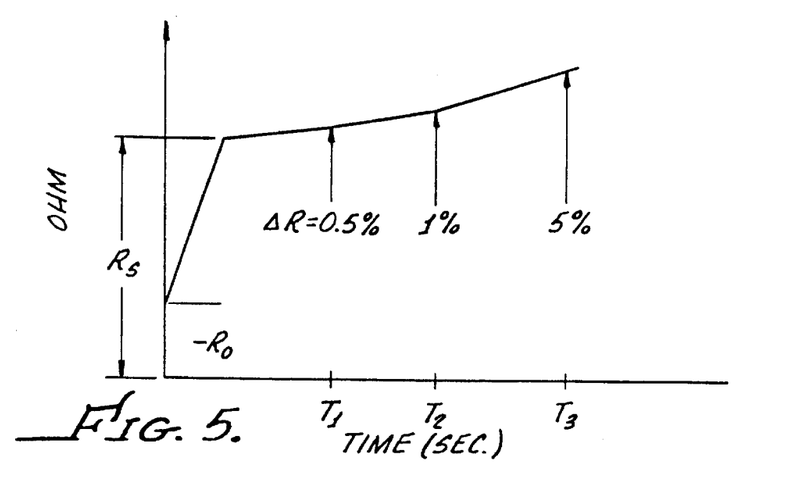
FIG. 5 illustrates a curve showing rise of resistance with time for an electrically stressed test line conductor.

To determine resistance rise, the conductive line is electrically stressed while its resistance is continuously monitored and ΔR continuously computed. FIG. 5 shows variation of resistance, above initial resistance $R_o$, as the line is electrically stressed. This figures shows points on the time/resistance curve of the electrically stressed line of which resistance ΔR is 0.5%, 1.0% and 5.0% respectively.

Figure 6:
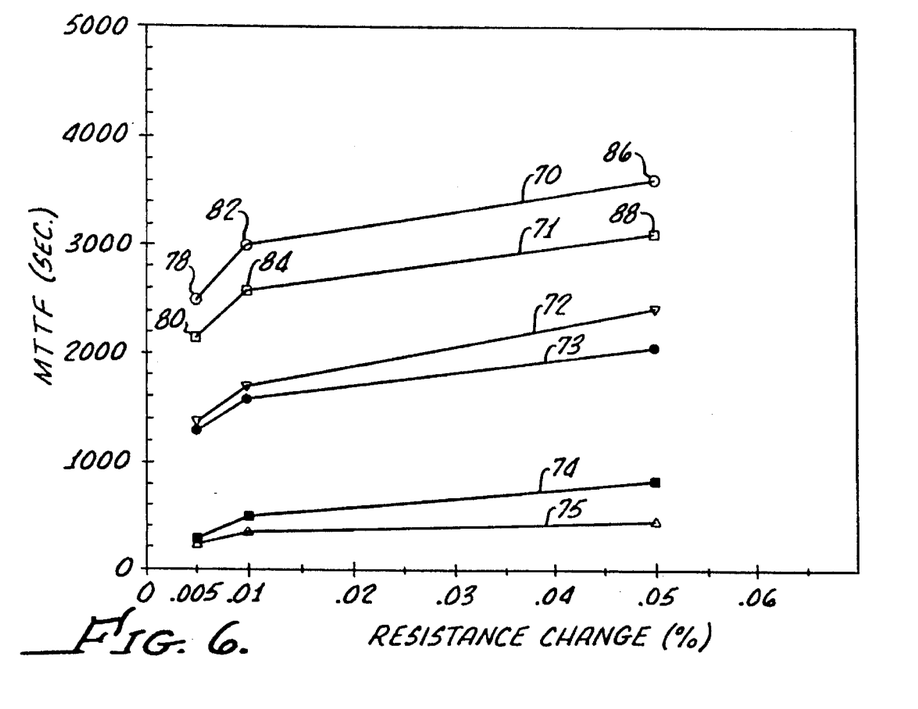
FIG. 6 is a set of curves showing variation of resistance rise with mean time to failure for several different current densities and a pair of different materials.

Utilizing one or more of these three critical resistance rises, metal test lines are stressed at several different current densities, while continuously monitoring resistance rise to record elapsed time at which the resistance rise reaches the selected resistance rise value of 0.5%, 1% or 5%. Experimental results of such tests are illustrated in FIG. 6, showing curves of elapsed time against resistance rise, including curves 70 and 71 for an aluminum line with 1% silicon and 0.75% silicon respectively, both stressed with current density of 13.18 million amps per square centimeter. Curves 72 and 73 show the 1% and 0.75% silicon respectively stressed at current densities of 13.50 million amps per square centimeter. Curves 74 and 75 show the 1% silicon and 0.75% silicon respectively stressed at a current density of 14.30 million amps per square centimeter. The initial plotted points of all of these curves, such as points 78 and 80, represent a resistance rise of 0.5%. The second plotted points, such as points 82 and 84, represent a resistance rise of 1.0%. The final plotted points, such as points 86 and 88 of the curves of FIG. 6, represent a resistance rise of 5%. From the curves of FIG. 6 it will be seen that the lifetime of the conductive leads increases as stressing current density decreases, largely due to the fact that higher current densities increase temperature and thus increase both grain boundary and bulk diffusion or electromigration.

Subsequent to electrical stressing to each of the selected resistance rises, the upper planarization silicon dioxide insulation layers (layers 15 of FIG. 2a) are removed to allow the lines to be examined by a scanning electron microscope to verify that the specimens have been stressed under conditions of predominantly grain boundary electromigration. A critical ΔR is selected from among the group initially selected based upon visual inspect to determine that the critical ΔR is the highest at which the void size is greatest and at which electromigration is predominantly grain boundary electromigration.

Therefore, according to criteria and procedures set forth above, a critical resistance rise $\Delta R_c$ is selected, as for example at a value of 0.5%. Now three or more tests are run, electrically stressing the conductive lines to enable calculation of the values Ea, N and A of Black's equation. It may be noted that each stress test is performed on a different one of the many test patterns that are laid down on the single silicon wafer, because, once having been electrically stressed by the very high current density employed herein, the line structure is no longer the same. Each of the tests for calculation of Ea, N and A are run at different current densities, which may be in the order of about thirty mega amperes per square centimeter. Each line is stressed with this current density while resistance is continuously monitored and resistance rise continuously calculated until the selected critical or failure value of $\Delta R_c$ is attained. At the time that the measured and calculated resistance rise reaches the critical value, elapsed time is recorded. Then, utilizing a temperature calculated according to Equations (2) and (3) (e.g., the local temperature at the void) and the recorded elapsed time as the failure time (MTTF) in Black's equation, the quantities Ea, N and A are calculated. These values provide information concerning grain boundary characteristics of the metal lines of the test pattern. Finally, after solving for values of Ea, N and A employing the calculated temperature, the value of MTTF, the expected life of the metal interconnect line, is determined by solution of Black's equation, employing a temperature equal to the highest anticipated actual operating temperature and the highest current density expected to be encountered in actual operation of the final ship assembly.

It may be noted that since no external heating is employed, no temperature induced diffusion in any of the test patterns not yet tested will occur prior the actual testing of that particular pattern.

There have been described methods for obtaining electromigration criteria for conditions in which grain boundary electromigration predominates so that these criteria may be employed in Black's equation for predicting integrated circuit lifetime. Novel methods are employed utilizing both empirical tests and calculation to select a critical resistance rise that is employed in tests run to determine electromigration criteria of Ea, A and N. In determining a critical resistance rise calculated temperature is employed together with a bow tie shaped conductive test pattern.

REFERENCES

[1] R. Pasco and J. Schwarz, *Solid-state Electrons*, vol. 26, pp. 445–452 (1983).
[2] B. Root and T. Turner, *IEEE/IRPS*, pp. 100–107 (1985).
[3] R. Jones and L. Smith, *J. Appl. Phys.*, vol. 66, pp. 4670–4678 (1987).
[4] C. Hong and D. Crook, *IEEE/IRPS*, pp. 119–127 (1985).

We claim:

1. A method for evaluating electromigration induced failure of a thin film conductor that is typical of thin film conductors incorporated in microcircuitry and other integrated circuits, wherein the conductor is subject to failure due to grain boundary and bulk electromigration of atoms in said conductor when the conductor is stressed by electric current and temperature, said method comprising the steps of:

forming a plurality of conductive test patterns on a semiconductor substrate, said conductive test patterns exhibiting a resistance rise $\Delta R$ when an electric current flows therein, selecting a critical value $\Delta R_c$ of resistance rise that results from electromigration that is predominantly grain boundary electromigration, electrically stressing said conductive test patterns at a plurality of current densities by application of electric current thereto, measuring resistance rise of said patterns as they are stressed, recording time elapsed until said measured resistance rise is at said critical value $\Delta R_c$, employing said recorded elapsed time to determine values of activation energy Ea, a proportionally constant A, and a current density exponent N in a first equation $MTTF = A(J)^{-N} \exp(Ea/KT)$, where MTTF is elapsed time, K is the Boltzmann constant, and T is temperature of said conductive test patterns, and solving said equation for MMTF for a predetermined current density and a temperature using said determined values of Ea, A and N;

wherein said step of selecting a critical value of $\Delta R$ for which temperature of the electrically stressed conductive test patterns is not greater than a temperature at which bulk electromigration predominates in said conductive test patterns.

2. The method of claim 1 wherein said step of selecting a critical value of $\Delta R$ comprises selecting a value of $\Delta R$ for which the temperature of the electrically stressed conductor test patterns is not greater than 460° C.

3. The method of claim 1 wherein said step of selecting a critical value of $\Delta R_c$ comprises the steps of calculating a curve of variation of temperature with change of width of a line of the conductive test patterns, employing said curve to determine line crack depth at a selected maximum temperature and calculating the critical resistance rise $\Delta R_c$ from said line crack depth and a nominal line width.

4. The method of claim 4 wherein said step of selecting the critical resistance rise $\Delta R_c$ includes the step of calculating resistance $R_v$ of a line of said conductive test pattern in accordance with the equation:

$$R_v = -(2R_o(1 + T_{CR}(T - T_o)/h) \ln(1 - (L/W))$$

where $R_o$ is resistivity of the line at room temperature, h is line thickness, L is line crack depth, W is nominal width of the line before stressing, $T - T_o$ is local temperature change, T is line temperature for an electrically stressed line and $T_o$ is temperature of an unstressed line.

5. The method of claim 1 wherein the temperature T of said first equation $(MTTF = A(J)^{-N} \exp(Ea/KT))$ is calculated as $T_M$ from a second equation:

$$T_M = Ta + \frac{J^2 R_o}{\Sigma[K_I/tt_I(1 + 0.88\, t_I/W)] - J^2 T_{CR} R_0}$$

and a third equation:

$$\Sigma[K_I/tt_I(1+0.88 t_I/W)] = K_I/tt_t(1+0.88 t_I/w) + K_I/tt_b(1+0.88 t_b/w) + 2 \times 0.88 K_I/tw)]$$

where
   Ta = room temperature,
   J = current density,
   $R_o$ = resistivity of metal at 0° C.,
   $K_I$ = thermal conductivity of the insulator,
   t = metal thickness,
   $t_I$, $t_t$ and $t_b$ = insulator thickness (top and bottom), and
   w = metal width.

6. The method of claim 5 including the steps of empirically determining $K_I$ by experimentally defining a curve of variation of temperature of an electrically stressed line with magnitude of current applied to stress the line, choosing a plurality of different assumed values of $K_I$ for each said assumed value of $K_I$ using the equation:

$$T_M = Ta + \frac{J^2 R_o}{\Sigma[K_I/tt_I(1 + 0.88 \, t_I/W)] - J^2 T_{CR} R_0}$$

to calculate a curve of variation of temperature with density of magnitude of current applied to stress the line.

7. The method of claim 5 including the steps of empirically determining $K_I$ by experimentally defining a curve of variation of temperature of an electrically stressed line with magnitude of current applied to stress the line, and empirically selecting a value of $K_i$ that fits said curve.

8. The method of claim 1 wherein said step of forming a plurality of test patterns comprises forming each said pattern with a plurality of relatively wider sections alternating with a plurality of narrower sections and a plurality of tapered width sections each positioned between a narrower and wider section.

9. The method of claim 1 wherein said conductive test patterns are formed of an alloy of aluminum and wherein said critical temperature rise is not greater than two percent.

10. The method of claim 1 wherein said conductive test patterns are formed of an alloy of aluminum and wherein said critical temperature rise is not greater than 0.5%.

* * * * *